(12) United States Patent
Patel et al.

(10) Patent No.: US 6,623,651 B2
(45) Date of Patent: Sep. 23, 2003

(54) CIRCUIT BOARD AND A METHOD FOR MAKING THE SAME

(75) Inventors: Bharat Patel, Canton, MI (US); Jay D. Baker, Dearborn, MI (US); Mohan Paruchuri, Canton, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 127 days.

(21) Appl. No.: 09/815,364

(22) Filed: Mar. 22, 2001

(65) Prior Publication Data

US 2001/0045407 A1 Nov. 29, 2001

Related U.S. Application Data

(60) Provisional application No. 60/207,647, filed on May 26, 2000.

(51) Int. Cl.[7] ................................................ H01B 13/00
(52) U.S. Cl. ......................................... 216/13; 174/254
(58) Field of Search ................................ 174/254, 255, 174/257, 262, 264, 265; 216/13

(56) References Cited

U.S. PATENT DOCUMENTS

| | | | |
|---|---|---|---|
| 3,801,388 A | | 4/1974 | Akiyama et al. |
| 4,404,059 A | | 9/1983 | Livshits et al. |
| 4,912,020 A | * | 3/1990 | King et al. .................. 430/311 |
| 5,118,386 A | * | 6/1992 | Kataoka et al. ................ 216/13 |
| 5,317,801 A | * | 6/1994 | Tanaka et al. ................. 29/830 |
| 5,442,144 A | * | 8/1995 | Chen et al. ................... 174/266 |
| 5,738,797 A | | 4/1998 | Belke, Jr. et al. |
| 5,891,367 A | * | 4/1999 | Basheer et al. ............. 252/514 |
| 6,222,136 B1 | * | 4/2001 | Appelt et al. ................ 174/254 |
| 6,323,434 B1 | * | 11/2001 | Kurita et al. ................ 174/255 |

* cited by examiner

Primary Examiner—Kin-Chan Chen
(74) Attorney, Agent, or Firm—Visteon Global Technologies, Inc.

(57) ABSTRACT

A method 10 for making a multi-layer electronic circuit board 98 having at least one electrically conductive protuberance 15 which forms a "via" and which traverses through the various layers of the electric circuit board 98, and further having at least one interconnection portion 102 which supports a wide variety of components and interconnection assemblies.

12 Claims, 4 Drawing Sheets

CIRCUIT BOARD AND A METHOD FOR MAKING THE SAME

This application claims benefit to provisional application No. 60/207,647 filed May 26, 2000.

FIELD OF THE INVENTION

The present invention relates to a circuit board and a method for making a multi-layer electrical circuit board and, more particularly, to a method for making a multi-layer electrical circuit board having at least one electrically conductive portion or "via" which traverses through the multi-layer electrical circuit board.

BACKGROUND OF THE INVENTION

Multi-layer circuit boards allow electrical components to selectively and operatively populate opposed surfaces of each board (or other respective interior portions of each of the boards), thereby desirably allowing each of the electrical circuit boards to contain a relatively large amount of electrical components which efficiently and densely populate the respective boards. It is desirable to allow each of the component-containing surfaces or portions of a created and/or formed electrical circuit board to communicate and/or to be interconnected, thereby allowing the contained electrical components to cooperatively and selectively form one or more desired electrical circuits. This desired communication and/or interconnection typically requires the use of shared electrical ground planes, the transmittal of power and/or control type signals between each of the component containing surfaces or board portions, and/or the selective connection of the contained components.

This desired communication and/or component interconnection typically requires that one or more holes be drilled through each of the circuit boards, thereby creating at least one "through hole" or "via" which traverses each of the opposed component containing surfaces and the various interior circuit board portions. Such drilling is undesirable since it is relatively time consuming, costly, potentially causes damage to significant numbers of the formed electrical circuit boards requiring these circuit boards to be destroyed, and requires costly and inefficient electroless and/or electrolytic plating of the formed holes or "vias".

While some attempts have been made to obviate the need for such plating, such as by the use of a conductive epoxy within each of the drilled holes, these attempts have not produced reliable electrical interconnections and these produced interconnections are not typically adapted to allow the communication of electrical power signals between the board surfaces and the formed apertures also do not securely and reliably receive a component.

Further, it is desirable to form "crossover type circuits" upon one or more selected surfaces and/or within certain component containing portions of the formed circuit board in order to allow multiple levels of circuits and/or electrical interconnections to be formed upon a single board surface or within a certain component containing portion of the circuit board, thereby desirably increasing the amount of electrical circuits which may be created upon and/or within the created circuit board.

The crossover circuits which are formed by these prior methodologies do not typically and efficiently accommodate certain desirable circuit board interconnection processes and/or schemes such as and without limitation, the use of relatively heavy wire (e.g., using aluminum wire having a diameter of about five thousandths of an inch to about twenty thousandths of an inch) or the direct connection of components to a surface of the board.

There is therefore a need to provide a method for producing a multi-layer electrical circuit board which overcomes some or all of the previously delineated drawbacks of prior circuit boards and/or circuit board forming methodologies, which selectively allows for the efficient creation of interconnection portions which traverse the various layers of the formed electric circuit board assembly, and which further allows for the efficient and selective formation of crossover members and/or circuits which desirably accommodate diverse types of circuit interconnection processes and/or schemes and which allow for the selective creation of a relatively large amount of circuits.

SUMMARY OF THE INVENTION

It is a first object of the present invention to provide a method for producing a multi-layer electrical circuit board which overcomes some or all of the previously delineated drawbacks of prior multi-layer electrical circuit board forming methodologies and techniques.

It is a second object of the invention to provide a method for producing a multi-layer electrical circuit board which overcomes some or all of the previously delineated drawbacks of prior multi-layer electrical circuit board forming methodologies and techniques, which allows for the selective, efficient, and reliable formation of electrically conductive interconnection portions which selectively and cooperatively allow for the communication and/or electrical connection by and between various electronic components, and which allows for the creation of crossover members and/or circuits, effective to increase the electrical circuit density within these formed boards.

It is a third object of the invention to provide a method for producing a multi-layer electrical circuit board which overcomes some or all of the previously delineated drawbacks of prior multi-layer electrical circuit board forming methodologies and techniques and which allows for the selective and efficient formation of crossover members which are adapted to accommodate a wide variety of components and component interconnection techniques and/or assemblies.

According to a first aspect of the present invention, a method for making a multi-layer electric circuit board is provided. The method includes the steps of providing a first member having a first and a second surface; selectively removing portions of the first surface of the first member, thereby creating at least a first and a second depressed portion within the first surface of the first member while allowing a third portion of the first surface to remain intact; filling the first and second depressed portions with a first material; applying a second material to the third portion; attachably overlaying a second member upon the third portion and upon the first material; forming at least one aperture within the second member and at least one aperture within the second surface of the first member; filling the at least one aperture within the second surface of the first member and filling the at least one aperture within the second member with the first material; applying the second material to the second surface of the first member and to the second member; connecting a third member to the first member and connecting a fourth member to the second member, thereby forming a multi-layer circuit assembly having an interconnection portion which extends through the formed multi-layer circuit and which is cooperatively formed by the third portion and by the second, third, and fourth members.

According to a second aspect of the present invention, a circuit assembly is provided. The circuit assembly is made by the process of providing a first electrically conductive member; selectively etching the first electrically conductive member, thereby creating at least one protuberance; placing a certain material upon said first electrically conductive member; and attaching a second electrically conductive member to the at least one protuberance and attaching a third electrically conductive member to the first electrically conductive member, thereby forming a multi-layer circuit board and causing the at least one protuberance to extend through the multi-layer circuit board.

According to a third aspect of the present invention, a circuit assembly is provided. The circuit assembly is made by the process of providing a first member; selectively etching the first member, thereby causing the first member to have at least one protuberance; providing a plurality of conductive members; and attaching the plurality of conductive members to the first member, thereby creating a multi-layer circuit assembly while causing the at least one protuberance to interconnectingly extend through the multi-layer circuit assembly.

These and other objects, aspects, and advantages of the present invention will become apparent upon reading the following detailed description in combination with the accompanying drawings.

DETAILED DESCRIPTION OF THE PREFERRED EMBODIMENT OF THE INVENTION

Figure 1A:
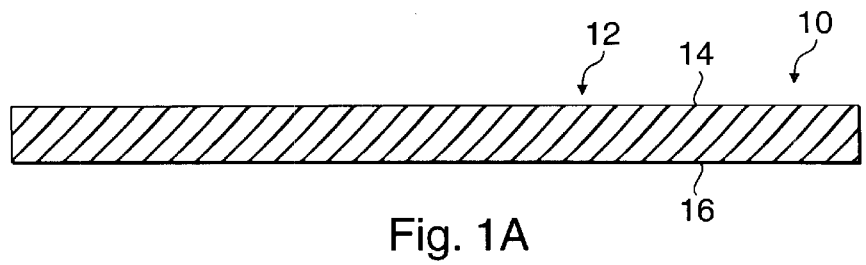
FIGS. 1(a)–(m) are successive sectional side views of a multi-layer circuit board being produced and/or formed in accordance with the teachings of the preferred embodiment of the invention.

Referring now to FIGS. 1(a)–(m), there is shown a process 10 for making an electrical circuit board assembly in accordance with the teachings of the preferred embodiment of the invention. Particularly, process 10 begins by obtaining and/or providing a member 12 having a first or top surface 14 and a second or bottom surface 16, as best shown in FIG. 1(a). In one non-limiting embodiment of the invention, member 12 comprises a conventional and commercially available electrically conductive material such as copper and is generally rectangular in shape. In a further non-limiting embodiment of the invention, the thickness of member 12 is about four one-thousandths of an inch, although other shapes, sizes, and/or thicknesses may be utilized.

Figure 1B:
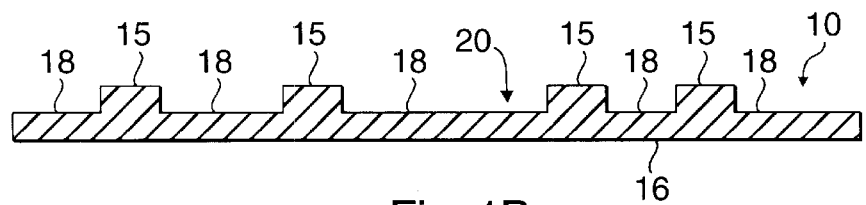

In the second step of process 10, which is best shown in FIG. 1(b), a pre-circuit assembly 20 is created by selectively removing some portions of top surface 14 of member 12 by a conventional etching process, thereby selectively creating several recessed or depressed portions 18 and several nubs, bumps, and/or protuberances 15 which comprise the portions of the top surface 14 which are left and/or remain intact by the foregoing etching process. As later explained, protuberances 15 of the top layer 14 selectively form interconnecting "vias" or "crossover" type members.

Figure 1C:
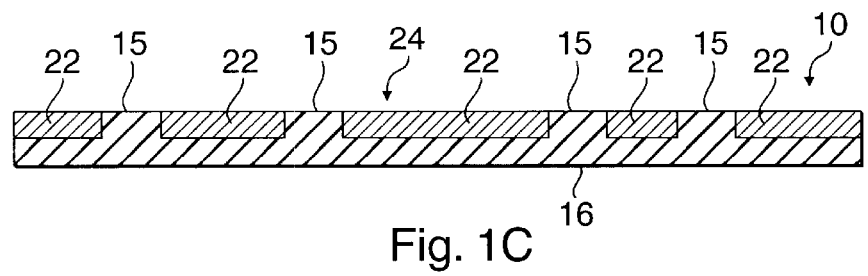

In the third step of process 10, which is best shown in FIG. 1(c), a certain substance or material 22 is applied upon member 12 and substantially "fills" depressed portions 18, thereby forming a pre-circuit assembly 24. In one non-limiting embodiment of the invention, material 22 comprises a conventional and commercially available dielectric material, such as an acrylic material.

Figure 1D:
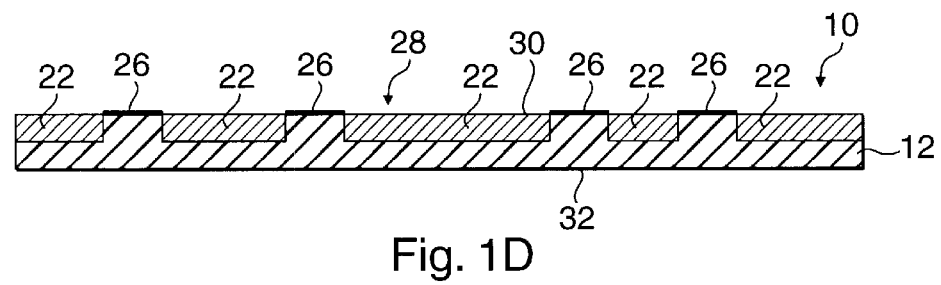

In the fourth step of process 10, which is best shown in FIG. 1(d), a layer of a certain substance or material 26 substantially "covers" and/or overlays each of the protuberances 15 to form a pre-circuit assembly 28 having a first or top surface 30 and a second or bottom surface 32. In one non-limiting embodiment of the invention, material 26 comprises a conventional and commercially available tin based alloy or any other conventional conductive epoxy material and is metallurgically bonded to protuberances 15.

Figure 1E:
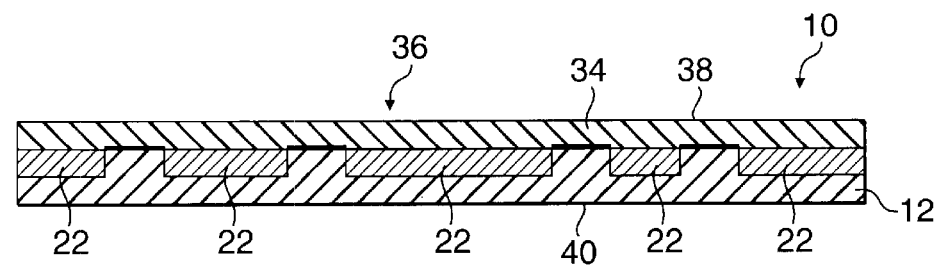

In the fifth step of the process 10, which is shown best in FIG. 1(e), a member 34 is attached to the top surface 30 of pre-circuit assembly 28, thereby forming pre-circuit assembly 36 having a first or top surface 38 and a second or bottom surface 40. In one non-limiting embodiment of the invention, member 34 comprises a conventional and commercially available electrically conductive material such as copper and has the substantially same size and shape as member 12. In a further non-limiting embodiment of the invention, the thickness of member 34 is about two thousandths of an inch, although other sizes, shapes, and/or thicknesses may be utilized. In a further non-limiting embodiment of the invention, member 34 is attached to the top surface 30 of pre-circuit assembly 28 by metallurgically bonding member 30 to the previously applied material 26 and by laminating member 34 to the previously applied material 22.

Figure 1F:
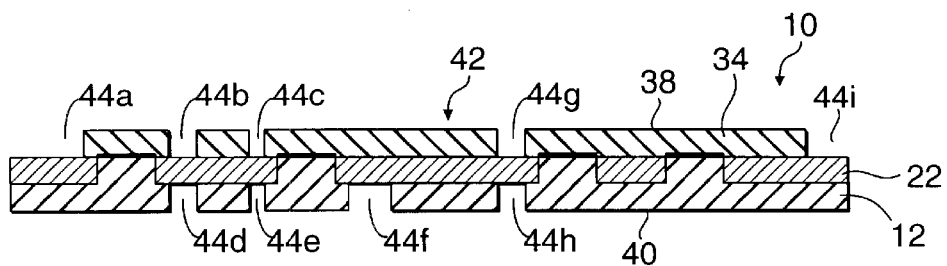

As best shown in FIG. 1(f), process 10 continues with the creation of a pre-circuit assembly 42 which is created by subjecting pre-circuit assembly 36 to a commercially available etchant material which selectively removes portions of members 12 and 34, thereby forming apertures within surfaces 38, 40 of pre-circuit assembly 36, and thereby creating several recessed or depressed portions 44(a)–44(i) within member 34 and member 12. Particularly, portions 44(c) and 44(e) are aligned (e.g., portion 44(e) is wholly disposed under portion 44(c) and is substantially similar in size and shape to portion 44(c)). Portions 44(g) and 44(h) are similarly aligned.

Figure 1G:
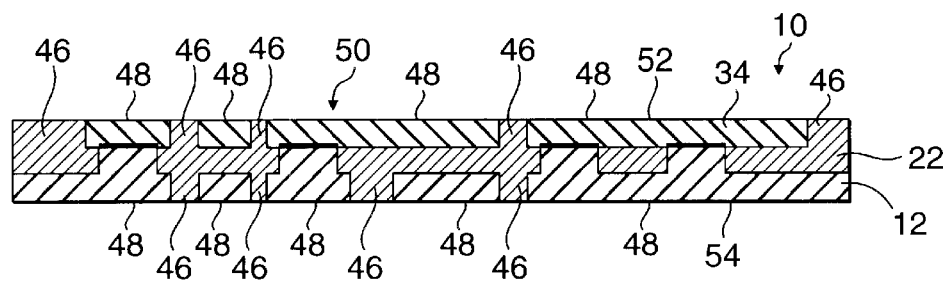

As best shown in FIG. 1(g), process 10 continues by further causing a certain substance or material 46 to substantially "fill" recessed or depressed portions 44(a–i) and further applying a certain substance or material 48 over the remaining or "unetched" or "unremoved" portions of surfaces 38, 40, thereby creating pre-circuit assembly 50 having a first or top surface 52 and a second or bottom surface 54.

In one non-limiting embodiment of the invention, material 46 comprises a conventional and commercially available dielectric and/or acrylic material and is substantially similar to and/or identical to material 22. In a further non-limiting embodiment of the invention, material 46 is laminated to members 12 and 34. In a further non-limiting embodiment of the invention, material 48 comprises a tin based alloy or any other suitable conductive epoxy material. In a further non-limiting embodiment of the invention, material 48 is substantially similar to and/or identical to material 26.

Figure 1H:
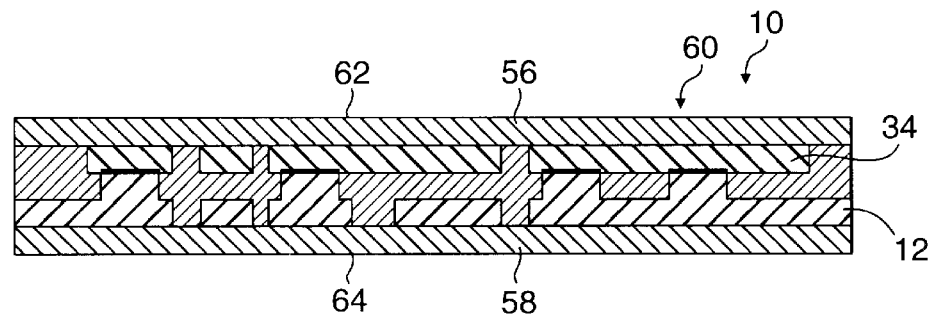

In the eighth step of the process 10, which is shown best in FIG. 1(h), a member 56 is operatively attached to the top surface 52 of pre-circuit assembly 50 (i.e., to member 34 and to material 48) and a member 58, substantially similar and/or identical to member 56, is operatively attached to the bottom surface 54 of pre-circuit assembly 50 (i.e., to member 12 and to material 48), thereby forming pre-circuit assembly 60 having a top surface 62 and a bottom surface 64. In one non-limiting embodiment of the invention, members 56, 58 each comprise a conventional and commercially available electrically conductive material such as copper. In a further non-limiting embodiment of the invention, the thickness of member 56 is about two thousandths of an inch and the thickness of member 58 is about two thousandths of an inch, although other thicknesses, sizes, and/or shapes may be utilized. In a further non-limiting embodiment of the invention, members 56, 58 are respectively metallurgically bonded to surfaces 52, 54 of pre-circuit assembly 50 and laminated to material 48 to form pre-circuit assembly 60.

Figure 1I:
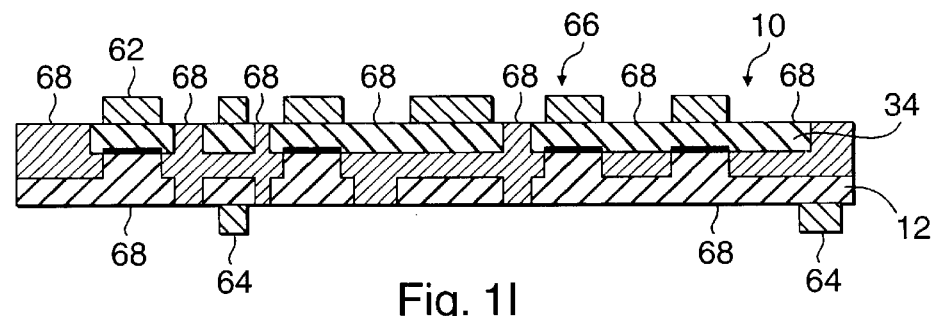

As best shown in FIG. 1(i), process 10 continues with the creation of a pre-circuit assembly 66 which is created by selectively subjecting members 56, 58 of pre-circuit assembly 60 to a commercially available etchant material which selectively forms apertures through surfaces 62, 64 (i.e., through members 56, 58) and creates recessed or depressed portions 68 within members 56, 58 of pre-circuit assembly 60.

Figure 1J:
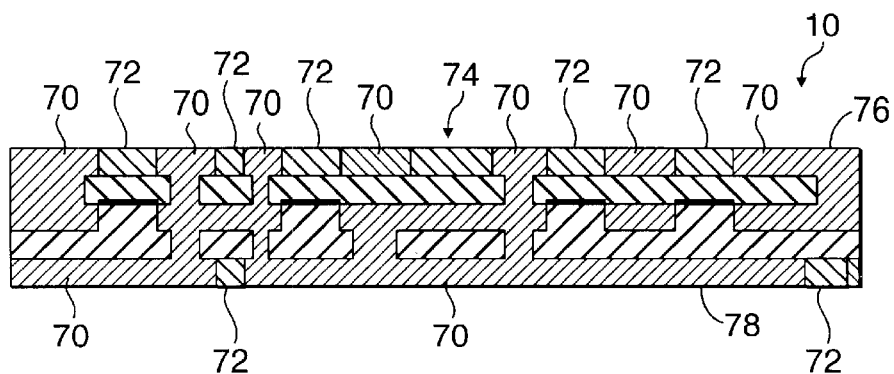

As best shown in FIG. 1(j), process 10 continues by applying a certain substance or material 70 to members 56, 58 effective to substantially "fill" recessed or depressed portions 68. A certain substance or material 72 is applied to and substantially "covers" and/or overlays the remaining or "unetched" or "unremoved" portions of surfaces 62, 64, thereby creating pre-circuit assembly 74 having a top surface 76 and a bottom surface 78.

In one non-limiting embodiment of the invention, material 70 comprises a conventional and commercially available dielectric and/or acrylic material and is substantially similar or identical to materials 22, 46. In a further non-limiting embodiment of the invention, material 70 is applied by laminating material 70 to members 56, 58. In a further non-limiting embodiment of the invention, material 72 comprises a conventional and commercially available tin based alloy or any other suitable conductive epoxy. In a further non-limiting embodiment of the invention, material 72 is substantially similar to materials 26, 48. In a further non-limiting embodiment of the invention, material 72 is metallurgically bonded to the remaining portions of surfaces 62, 64.

Figure 1K:
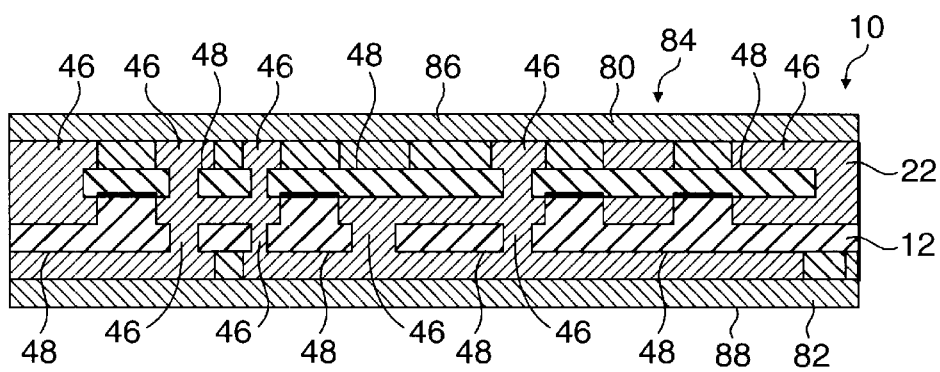

In the eighth step of the process 10, which is shown best in FIG. 1(k), a member 80 is operatively attached to the top surface 76 of pre-circuit assembly 74 (i.e., to material 70 and 72) and a member 82, substantially similar or identical to layer 80, is operatively attached to the bottom surface 78 of pre-circuit assembly 74 (i.e., to material 70 and 72), thereby forming pre-circuit assembly 84 having a top surface 86 and a bottom surface 88. In one non-limiting embodiment of the invention, members 80, 82 comprise a conventional and commercially available electrically conductive material such as copper. In a further non-limiting embodiment of the invention, the thickness of layer 80 is about two thousandths of an inch and the thickness of layer 82 is about is about two thousandths of an inch, although other sizes, shapes, and thicknesses may be utilized. In a further non-limiting embodiment of the invention, members 80, 82 are respectively and metallurgically bonded to the material 72 resident on surfaces 76, 78 and respectively laminated to the material 70 resident on surfaces 76, 78, thereby forming a pre-circuit assembly 84.

Figure 1L:
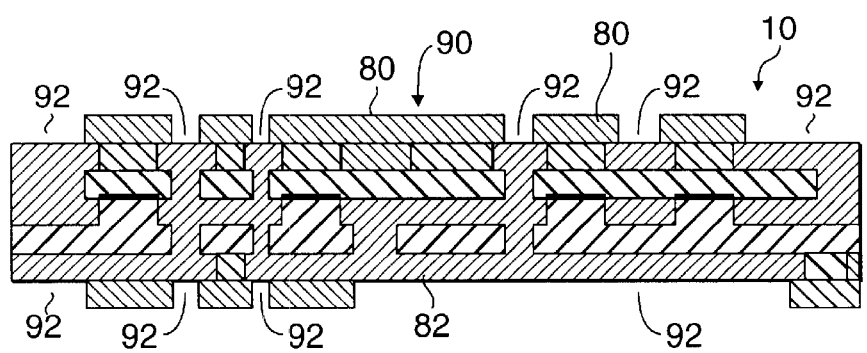

As best shown in FIG. 1(l), process 10 continues with the creation of a pre-circuit assembly 90 which is created by selectively subjecting members 80, 82 of pre-circuit assembly 84 to a commercially available etchant material which selectively forms apertures through surfaces 86, 88 and creates recessed or depressed portions 92 within members 80, 82 of pre-circuit assembly 84.

Figure 1M:
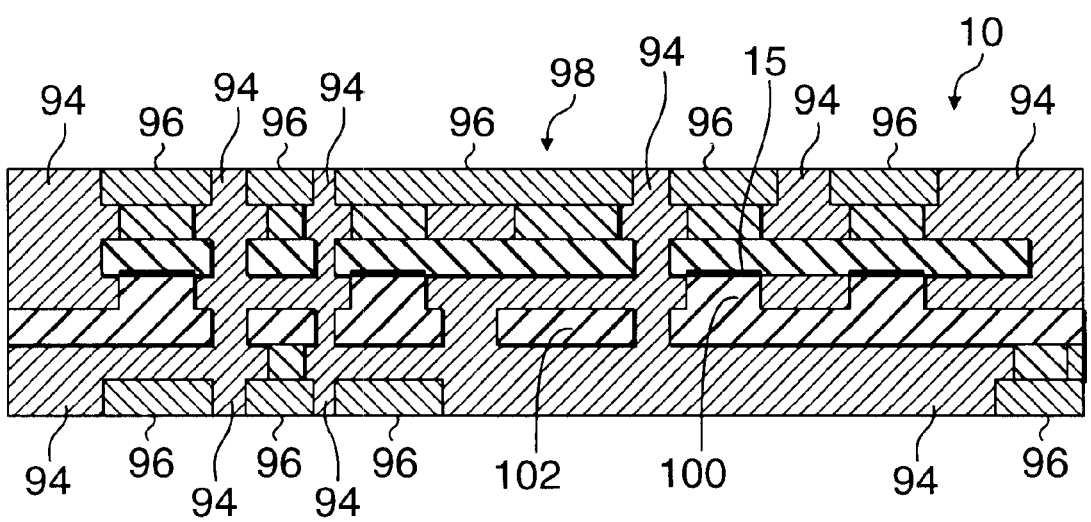

As best shown in FIG. 1(m), process 10 continues by applying and/or attaching a certain substance or material 94 upon members 80, 82, effective to substantially "fill" recessed or depressed portions 92 in pre-circuit assembly 90. Further, a certain substance or material 96 is made to substantially "cover" or overlay those unetched or remaining portions of surfaces 86, 88, thereby creating a multi-layer circuit assembly or circuit board 98. In one non-limiting embodiment of the invention, material 94 comprises a conventional and commercially available dielectric and/or acrylic material and is substantially similar or identical to materials 22, 46, 70. In a further non-limiting embodiment of the invention, material 94 is applied by laminating material 94 to members 80, 82. In a further non-limiting embodiment of the invention, material 96 comprises a conventional and commercially available tin based alloy or any other suitable conductive epoxy. In one non-limiting embodiment of the invention, material 96 is substantially similar to and/or identical to materials 26, 48, 72. In a further non-limiting embodiment of the invention, material 96 is metallurgically bonded to surfaces 86, 88 (i.e., to members 80, 82). It should be appreciated that multi-layer circuit board and/or assembly 98 includes electrically conductive "vias" or interconnection portions, such as portion 100, which traverse the multi-layer electrical circuit board 98, and which allows the various layers or members 12, 34, 56, 58, 80, and 82 to be electrically interconnected. Each interconnection portion, such as portion 100, thereby extends a unique one of each of protuberances 15 trough the formed multi-layer circuit assembly 98 while obviating the need to drill and/or electroplate a formed aperture.

It should be appreciated that the selective etching of members 12, 34, 56, 58, 80, 82 allows the crossover connections, such as crossover connection 102, to be efficiently and relatively easily formed in a cost-effective manner. Further, such selectively formed crossover connections, such as 102 are adapted to support a wide variety of components and interconnection assemblies as these crossover connections or members 102 may have a selected size and shape.

It should further be appreciated that multi-layer circuit assembly 98 may, in one non-limiting embodiment of this invention, serve as a pre-circuit assembly and be further subjected to the processes found in process steps 1(d), 1(e), 1(f), 1(h), 1(i), and 1(j). Particularly, multi-layer circuit assembly 98 may be selective "grown" or "expanded" by selectively adding additional interconnecting layers.

It should be understood that the invention is not limited to the exact embodiment or construction which has been illustrated and described but that various changes may be made without departing from the spirit and the scope of the invention.

What is claimed is:

1. A method for making an electrical circuit assembly comprising the steps of:

providing a first member having a first and a second surface;

selectively removing portions of said first surface of said first member, thereby creating at least a first and a second depressed portion within said first surface of the first member while allowing a third portion of said first surface to remain intact;

filling said first and second depressed portions with a first material;

applying a second material to said third portion;

attachably overlaying a second member upon said third portion and upon said first material;

forming at least one aperture within said second member and at least one aperture within said second surface of said first member;

filling said at least one aperture within said second surface of said first member and filling said at least one aperture within said second member with said first material;

applying said second material to said second surface of said first member and to said second member; and connecting a third member to said first member and connecting a fourth member to said second member, thereby forming a multi-layer circuit assembly having an interconnection portion which extends through the formed multi-layer circuit assembly which is cooperatively formed by said third portion and by said second, third, and fourth members.

2. The method of claim 1 wherein said first, second, third, and fourth members each comprise copper material.

3. The method of claim 1 wherein said first material comprises acrylic material.

4. The method of claim 1 wherein said second material comprises conductive epoxy.

5. The method of claim 1 wherein said second material comprises a tin alloy.

6. The method of claim 1 wherein said step of selectively removing portions of said first surface of said first member comprises selectively etching portions of said first surface of said first member.

7. The method of claim 1 wherein the step of attachably overlaying said second member upon said third portion and upon said first material comprises laminating said second member upon said third portion and upon said first material.

8. The method of claim 1 wherein said step of connecting said third member to said first member and connecting said fourth member to said second member comprises laminating said third member to said first member and laminating said fourth member to said second member.

9. The method of claim 1 further comprising the steps of:

forming at least one aperture within said third member and at least one aperture within said fourth member;

filling said at least one aperture within said third member and filling said at least one aperture within said fourth member with said first material;

applying said second material to said third member and to said fourth member;

connecting a fifth member to said third member and to said first material and connecting a sixth member to said fourth member and to said first material;

forming at least one aperture within said fifth member and at least one aperture within said sixth member;

filling said at least one aperture within said fifth member and filling said at least one aperture within said sixth member with said first material; and applying said second material to said fifth member and to said sixth member, thereby forming a second circuit assembly.

10. The method of claim 9 wherein said fifth and said sixth members each comprise copper material.

11. The method of claim 9 wherein said step of forming at least one aperture within said third member and at least one aperture within said fourth member comprises selectively etching portions of said third member and said fourth member.

12. The method of claim 11 wherein said step of forming at least one aperture within said fifth member and at least one aperture within said sixth member comprises selectively etching portions of said fifth member and said sixth member.

* * * * *